(12) United States Patent
Hartung et al.

(10) Patent No.: US 9,729,118 B2
(45) Date of Patent: Aug. 8, 2017

(54) LOUDNESS MATCHING

(71) Applicant: Sonos, Inc., Santa Barbara, CA (US)

(72) Inventors: Klaus Hartung, Santa Barbara, CA (US); Matthew Buoni, Goleta, CA (US); Romi Kadri, Cambridge, MA (US)

(73) Assignee: Sonos, Inc., Santa Barbara, CA (US)

( * ) Notice: Subject to any disclaimer, the term of this patent is extended or adjusted under 35 U.S.C. 154(b) by 0 days.

(21) Appl. No.: 14/809,140

(22) Filed: Jul. 24, 2015

(65) Prior Publication Data
US 2017/0026015 A1   Jan. 26, 2017

(51) Int. Cl.
| | | |
|---|---|---|
| *H03G 3/30* | (2006.01) | |
| *H03G 3/32* | (2006.01) | |
| *H03G 3/20* | (2006.01) | |
| *H03G 5/00* | (2006.01) | |
| *G10L 21/034* | (2013.01) | |
| *H03G 5/16* | (2006.01) | |
| *H03G 5/02* | (2006.01) | |

(52) U.S. Cl.
CPC ......... *H03G 3/3005* (2013.01); *G10L 21/034* (2013.01); *H03G 3/20* (2013.01); *H03G 3/32* (2013.01); *H03G 5/005* (2013.01); *H03G 5/025* (2013.01); *H03G 5/16* (2013.01); *H03G 5/165* (2013.01)

(58) Field of Classification Search
CPC ........ H03G 3/3005; H03G 5/16; H03G 5/005; H03G 3/20; H03G 3/32; H03G 5/165; G10L 21/034
See application file for complete search history.

(56) References Cited

U.S. PATENT DOCUMENTS

| | | | |
|---|---|---|---|
| 4,995,778 A | 2/1991 | Bruessel | |
| 5,440,644 A | 8/1995 | Farinelli et al. | |
| 5,761,320 A | 6/1998 | Farinelli et al. | |
| 5,910,991 A | 6/1999 | Farrar | |

(Continued)

FOREIGN PATENT DOCUMENTS

| | | |
|---|---|---|
| EP | 1133896 B1 | 8/2002 |
| EP | 1389853 A1 | 2/2004 |

(Continued)

OTHER PUBLICATIONS

"AudioTron Quick Start Guide, Version 1.0", Voyetra Turtle Beach, Inc., Mar. 2001, 24 pages.

(Continued)

*Primary Examiner* — Brenda Bernardi
(74) *Attorney, Agent, or Firm* — McDonnell Boehnen Hulbert & Berghoff LLP

(57) ABSTRACT

An example method may involve a device determining a first loudness representation for a playback device based on a first equalization setting applied to a representation of average music. The device may also determine a second loudness representation for the playback device, based on a second equalization setting applied to the representation of average music. The device may also determine a loudness adjustment factor based on the first and second loudness representations, and then causing the playback device to play back media based on the second equalization setting and the determined loudness adjustment factor.

18 Claims, 8 Drawing Sheets

(56) References Cited

U.S. PATENT DOCUMENTS

| | | |
|---|---|---|
| 5,923,902 A | 7/1999 | Inagaki |
| 6,032,202 A | 2/2000 | Lea et al. |
| 6,256,554 B1 | 7/2001 | DiLorenzo |
| 6,404,811 B1 | 6/2002 | Cvetko et al. |
| 6,469,633 B1 | 10/2002 | Wachter |
| 6,522,886 B1 | 2/2003 | Youngs et al. |
| 6,611,537 B1 | 8/2003 | Edens et al. |
| 6,631,410 B1 | 10/2003 | Kowalski et al. |
| 6,757,517 B2 | 6/2004 | Chang |
| 6,778,869 B2 | 8/2004 | Champion |
| 7,072,477 B1 * | 7/2006 | Kincaid ............... G06Q 99/00 340/392.3 |
| 7,130,608 B2 | 10/2006 | Hollstrom et al. |
| 7,130,616 B2 | 10/2006 | Janik |
| 7,143,939 B2 | 12/2006 | Henzerling |
| 7,236,773 B2 | 6/2007 | Thomas |
| 7,295,548 B2 | 11/2007 | Blank et al. |
| 7,483,538 B2 | 1/2009 | McCarty et al. |
| 7,490,044 B2 | 2/2009 | Kulkarni |
| 7,519,188 B2 | 4/2009 | Berardi et al. |
| 7,571,014 B1 | 8/2009 | Lambourne et al. |
| 7,630,500 B1 | 12/2009 | Beckman et al. |
| 7,630,501 B2 | 12/2009 | Blank et al. |
| 7,643,894 B2 | 1/2010 | Braithwaite et al. |
| 7,657,910 B1 | 2/2010 | McAulay et al. |
| 7,853,341 B2 | 12/2010 | McCarty et al. |
| 7,987,294 B2 | 7/2011 | Bryce et al. |
| 8,014,423 B2 | 9/2011 | Thaler et al. |
| 8,045,952 B2 | 10/2011 | Qureshey et al. |
| 8,063,698 B2 | 11/2011 | Howard |
| 8,103,009 B2 | 1/2012 | McCarty et al. |
| 8,139,774 B2 | 3/2012 | Berardi et al. |
| 8,160,281 B2 | 4/2012 | Kim et al. |
| 8,175,292 B2 | 5/2012 | Aylward et al. |
| 8,229,125 B2 | 7/2012 | Short |
| 8,233,632 B1 | 7/2012 | MacDonald et al. |
| 8,234,395 B2 | 7/2012 | Millington et al. |
| 8,238,578 B2 | 8/2012 | Aylward |
| 8,243,961 B1 | 8/2012 | Morrill |
| 8,265,310 B2 | 9/2012 | Berardi et al. |
| 8,290,185 B2 | 10/2012 | Kim |
| 8,306,235 B2 | 11/2012 | Mahowald |
| 8,325,935 B2 | 12/2012 | Rutschman |
| 8,331,585 B2 | 12/2012 | Hagen et al. |
| 8,391,501 B2 | 3/2013 | Khawand et al. |
| 8,452,020 B2 | 5/2013 | Gregg et al. |
| 8,483,853 B1 | 7/2013 | Lambourne |
| 8,577,045 B2 | 11/2013 | Gibbs |
| 8,600,075 B2 | 12/2013 | Lim |
| 8,620,006 B2 | 12/2013 | Berardi et al. |
| 8,855,319 B2 | 10/2014 | Liu et al. |
| 8,879,761 B2 | 11/2014 | Johnson et al. |
| 8,914,559 B2 | 12/2014 | Kalayjian et al. |
| 8,934,647 B2 | 1/2015 | Joyce et al. |
| 8,934,655 B2 | 1/2015 | Breen et al. |
| 8,965,546 B2 | 2/2015 | Visser et al. |
| 8,977,974 B2 | 3/2015 | Kraut |
| 8,984,442 B2 | 3/2015 | Pirnack et al. |
| 9,020,153 B2 | 4/2015 | Britt, Jr. |
| 9,391,575 B1 * | 7/2016 | Yang ................... H03G 3/3005 |
| 2001/0042107 A1 | 11/2001 | Palm |
| 2002/0022453 A1 | 2/2002 | Balog et al. |
| 2002/0026442 A1 | 2/2002 | Lipscomb et al. |
| 2002/0124097 A1 | 9/2002 | Isely et al. |
| 2003/0157951 A1 | 8/2003 | Hasty |
| 2004/0024478 A1 | 2/2004 | Hans et al. |
| 2007/0142944 A1 | 6/2007 | Goldberg et al. |
| 2010/0142735 A1 | 6/2010 | Yoon et al. |
| 2011/0170710 A1 | 7/2011 | Son |
| 2011/0274293 A1 * | 11/2011 | Yue ........................ H04M 1/60 381/107 |
| 2012/0027227 A1 * | 2/2012 | Kok ........................ H03G 3/32 381/107 |
| 2012/0051558 A1 | 3/2012 | Kim et al. |
| 2012/0114127 A1 * | 5/2012 | Yamashita ........... H03G 3/3005 381/56 |
| 2012/0127831 A1 | 5/2012 | Gicklhorn et al. |
| 2012/0209602 A1 | 8/2012 | Naylor |
| 2012/0263325 A1 | 10/2012 | Freeman et al. |
| 2013/0010970 A1 | 1/2013 | Hegarty et al. |
| 2013/0028443 A1 | 1/2013 | Pance et al. |
| 2013/0259254 A1 | 10/2013 | Xiang et al. |
| 2014/0016784 A1 | 1/2014 | Sen et al. |
| 2014/0016786 A1 | 1/2014 | Sen |
| 2014/0016802 A1 | 1/2014 | Sen |
| 2014/0023196 A1 | 1/2014 | Xiang et al. |
| 2014/0037107 A1 * | 2/2014 | Marino, Jr. .............. H03G 3/10 381/107 |
| 2014/0044268 A1 * | 2/2014 | Herberger ................ H03G 3/20 381/56 |
| 2014/0093098 A1 * | 4/2014 | Chang ................... H03G 3/3005 381/105 |
| 2014/0112481 A1 | 4/2014 | Li et al. |
| 2014/0205111 A1 * | 7/2014 | Hatanaka ............... H03G 5/025 381/103 |
| 2014/0219456 A1 | 8/2014 | Morrell et al. |
| 2014/0226823 A1 | 8/2014 | Sen et al. |
| 2014/0294200 A1 | 10/2014 | Baumgarte et al. |
| 2014/0328500 A1 * | 11/2014 | Patwardhan ............ H03G 5/16 381/107 |
| 2014/0355768 A1 | 12/2014 | Sen et al. |
| 2014/0355794 A1 | 12/2014 | Morrell et al. |
| 2015/0063610 A1 | 3/2015 | Mossner |
| 2015/0117685 A1 * | 4/2015 | Reiss ................... G11B 27/031 381/300 |
| 2015/0146886 A1 | 5/2015 | Baumgarte |
| 2015/0163266 A1 | 6/2015 | Chatterjee et al. |
| 2015/0201274 A1 | 7/2015 | Ellner et al. |
| 2015/0281866 A1 | 10/2015 | Williams et al. |
| 2016/0259621 A1 * | 9/2016 | Aggarwal ................ H03G 3/20 |

FOREIGN PATENT DOCUMENTS

| | | |
|---|---|---|
| EP | 1825713 B1 | 10/2012 |
| EP | 2860992 A1 | 4/2015 |
| JP | 04003508 A * | 1/1992 |
| JP | 2015115615 A | 6/2015 |
| WO | 01/53994 A2 | 7/2001 |
| WO | 03093950 A2 | 11/2003 |
| WO | 2014033569 A1 | 6/2014 |
| WO | 2014160548 A1 | 10/2014 |
| WO | 2015024881 A1 | 2/2015 |

OTHER PUBLICATIONS

"AudioTron Reference Manual, Version 3.0", Voyetra Turtle Beach, Inc., May 2002, 70 pages.

"AudioTron Setup Guide, Version 3.0", Voyetra Turtle Beach, Inc., May 2002, 38 pages.

Bluetooth. "Specification of the Bluetooth System: The ad hoc SCATTERNET for affordable and highly functional wireless connectivity" Core, Version 1.0 A, Jul. 26, 1999, 1068 pages.

Bluetooth. "Specification of the Bluetooth System: Wireless connections made easy" Core, Version 1.0 B, Dec. 1, 1999, 1076 pages.

Dell, Inc. "Dell Digital Audio Receiver: Reference Guide" Jun. 2000, 70 pages.

Dell, Inc. "Start Here" Jun. 2000, 2 pages.

Jo et al., "Synchronized One-to-many Media Streaming with Adaptive Playout Control," Proceedings of SPIE, 2002, pp. 71-82, vol. 4861.

Jones, Stephen, "Dell Digital Audio Receiver: Digital upgrade for your analog stereo" Analog Stereo Jun. 24, 2000 retrieved Jun. 18, 2014, 2 pages.

Louderback, Jim, "Affordable Audio Receiver Furnishes Homes With MP3" TechTV Vault. Jun. 28, 2000 retrieved Jul. 10, 2014, 2 pages.

Palm, Inc., "Handbook for the Palm VII Handheld," May 2000, 311 pages.

Presentations at WinHEC 2000, May 2000, 138 pages.

(56) References Cited

OTHER PUBLICATIONS

UPnP; "Universal Plug and Play Device Architecture"; Jun. 8, 2000; version 1.0; Microsoft Corporation; pp. 1-54.
International Searching Authority, Partial International Search Report, dated Oct. 28, 2016, issued in connection with International Application No. PCT/US2016/043539, dated Jul. 22, 2016, 8 pages.
"Denon 2003-2004 Product Catalog," Denon, 2003-2004, 44 pages.
U.S. Appl. No. 60/490,768, dated Jul. 28, 2003, entitled "Method for synchronizing audio playback between multiple networked devices," 13 pages.
U.S. Appl. No. 60/825,407, dated Sep. 12, 2003, entitled "Controlling and manipulating groupings in a multi-zone music or media system," 82 pages.
Yamaha DME 64 Owner's Manual; copyright 2004, 80 pages.
Yamaha DME Designer 3.5 setup manual guide; copyright 2004, 16 pages.
Yamaha DME Designer 3.5 User Manual; Copyright 2004, 507 pages.
International Searching Authority, International Search Report and Written Opinion dated Feb. 13, 2017, issued in connection with International Application No. PCT/US2016/043539 dated Jul. 22, 2016, 23 pages.
Non-Final Office Action dated Feb. 24, 2017, issued in connection with U.S. Appl. No. 15/359,707, dated Nov. 23, 2016, 7 pages.

* cited by examiner

LOUDNESS MATCHING

FIELD OF THE DISCLOSURE

The disclosure is related to consumer goods and, more particularly, to methods, systems, products, features, services, and other elements directed to media playback or some aspect thereof.

BACKGROUND

Options for accessing and listening to digital audio in an out-loud setting were limited until in 2003, when SONOS, Inc. filed for one of its first patent applications, entitled "Method for Synchronizing Audio Playback between Multiple Networked Devices," and began offering a media playback system for sale in 2005. The Sonos Wireless HiFi System enables people to experience music from many sources via one or more networked playback devices. Through a software control application installed on a smartphone, tablet, or computer, one can play what he or she wants in any room that has a networked playback device. Additionally, using the controller, for example, different songs can be streamed to each room with a playback device, rooms can be grouped together for synchronous playback, or the same song can be heard in all rooms synchronously.

Given the ever growing interest in digital media, there continues to be a need to develop consumer-accessible technologies to further enhance the listening experience.

BRIEF DESCRIPTION OF THE DRAWINGS

Features, aspects, and advantages of the presently disclosed technology may be better understood with regard to the following description, appended claims, and accompanying drawings where:

Figure 1:
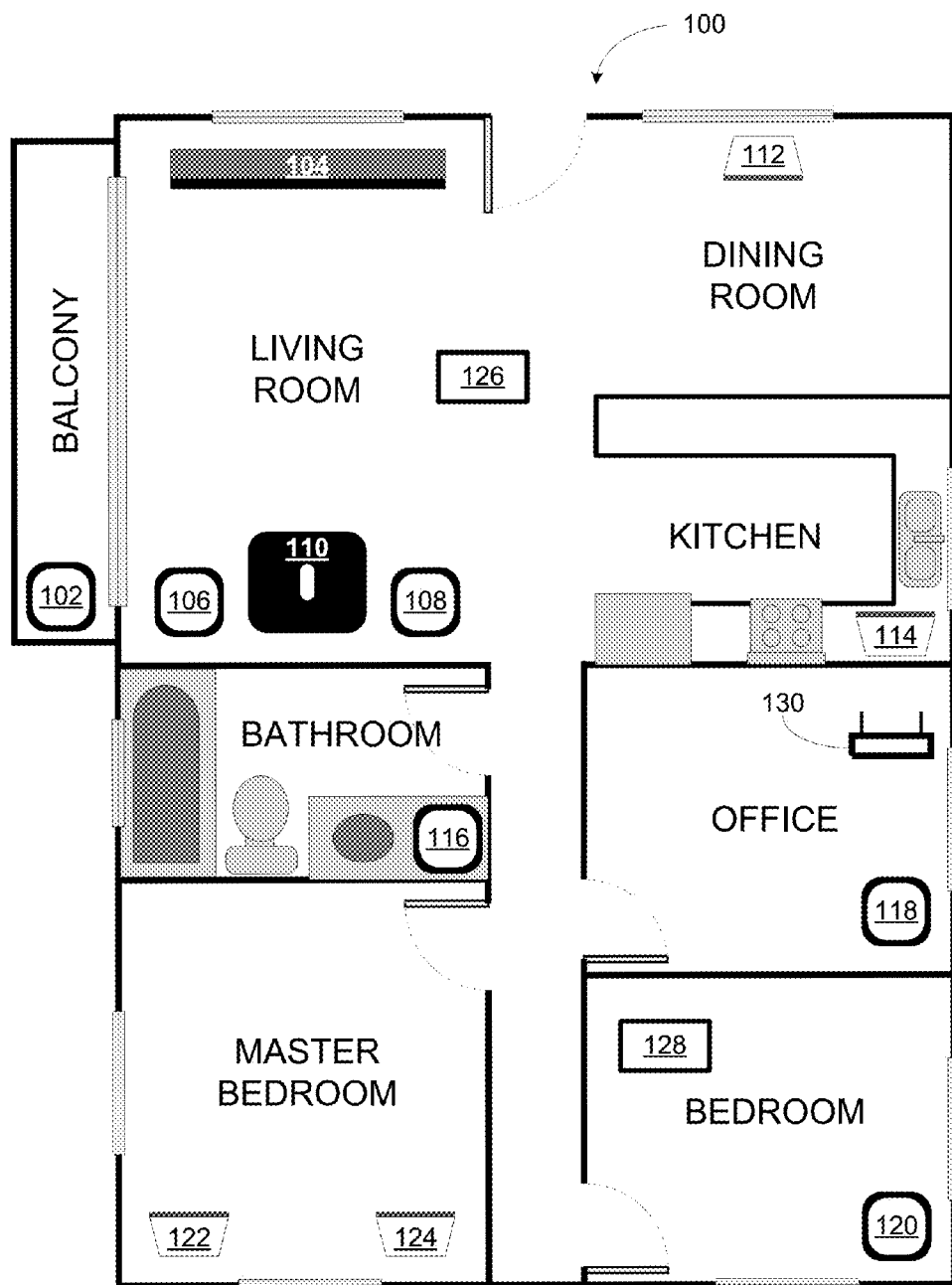
FIG. 1 shows an example media playback system configuration in which certain embodiments may be practiced.

The drawings are for the purpose of illustrating example embodiments, but it is understood that the inventions are not limited to the arrangements and instrumentality shown in the drawings.

DETAILED DESCRIPTION

I. Overview

Examples described herein involve loudness matching on a playback device. For instance, a playback device in a media playback system may play back media according to two or more equalization settings. As used herein, a playback device's equalization setting, or "EQ", generally refers to the levels of frequency response of an audio signal to be played back. The use of different EQs may result in a different perceived loudness for media that is played back, therefore the playback device may account for this different by matching the perceived loudness between the EQs.

A playback device may utilize more than one EQ for a variety of reasons. For example, different EQs may be better suited for different genres of music that might be played back. An EQ that is desirable for listening to classical music may be different than an EQ that is well-suited for rock or blues music. Similarly, different EQs may be associated with different media content sources for the playback device. For instance, a playback device may play back audio content from a music streaming service, a video streaming service for watching television and movies, a line-in from a cable or satellite set-top box or other connected multimedia device, among other possibilities. Each of these content sources may have a corresponding EQ that is suited for that particular type of content.

Additionally, the acoustics of an environment in which a playback device is used may vary from location to location within the environment. Therefore, a play back device may undergo a calibration procedure after it is positioned at a desired location in a media playback environment. The calibration procedure may involve, for instance, the playback device emitting a series of tones that may be detected by a microphone within the environment. The calibration procedure may be used determine an EQ for the playback device that takes into account the particular acoustic characteristics of the environment.

Moreover, the human auditory system perceives certain frequency ranges with greater or less sensitivity than others, and thus humans do not hear all audio signals the same. For instance, audio signals between 1-4 kHz typically sound the loudest for a given intensity of the signal. Consequently, a playback device might play back the same media twice with the same volume (i.e., intensity) setting, however a listener may actually perceive an increase or decrease in loudness if the playback device's EQ is different from the first play back to the second.

Therefore, it may be desirable to determine the human-perceived loudness of a playback device's EQ setting when it is used for media play back, and to match this perceived loudness if the EQ of the playback device changes. This loudness matching may occur, for instance, when the playback device changes from using a first EQ to using a second EQ. The second EQ may be a new EQ resulting from a calibration procedure. Alternatively, the second EQ may be a pre-determined EQ that is used based on a change in playback content.

The loudness matching examples herein are not limited to a first and second EQ on a single playback device. For instance, loudness matching may be performed between multiple playback devices that have different EQs. An example of this might be loudness matching between playback devices in a bonded zone.

In some cases, a playback device that performs the loudness matching may store both the first and second EQs in memory as one or more audio processing coefficients. The playback device may convert the first and second EQ to the frequency domain and then multiply each EQ with a representation of average music. The representation of average music may be a power-frequency dropoff curve that approximates the frequency response of the media content that is to be played back by the playback device. It may be predetermined, user selected, or it may be generated based on specific media to be played back.

Multiplying the first EQ by the representation of average music yields the power-spectral density of "average music," subject to the first EQ. The playback device may then pass the first power-spectral density through a loudness determination algorithm. In doing so, the playback device may determine a loudness constant that represents the loudness of average music when it is subject to the first EQ.

The playback device may perform the same operations with respect to the second EQ, determining a second power-spectral density of "average music" subject to the second EQ, and then determining a second loudness constant representing the loudness of average music subject to the second EQ. The two loudness constants may then be compared and a loudness adjustment factor determined. The loudness adjustment factor may then be used as a multiplier for the associated EQ, depending on which loudness is selected as the preferred loudness. This selection may be automatic, always implementing the loudness of the first EQ. In other examples, a user might select the second loudness as the loudness to be matched. Other possibilities also exist.

In this way, a playback device may generally maintain a perceived play back loudness when changing between music genres, content sources, etc., or when being moved from one location in a media playback environment to another. Moreover, it may allow a new playback device that is introduced into a media playback environment or added to a specific playback zone to match the perceived loudness output of another playback device that is already present. And by adding loudness matching to the calibration routine of one or more playback devices, calibration may also be improved.

As indicated above, example techniques involve loudness matching on a playback device. In one aspect, a method is provided. The method may involve (a) determining a first loudness representation for a playback device, where the playback device includes a first equalization setting, and where the first loudness representation is based on the first equalization setting applied to a representation of average music; (b) determining a second loudness representation for the playback device, where the playback device includes a second equalization setting, and where the second loudness representation is based on the second equalization setting applied to the representation of average music; (c) determining a loudness adjustment factor based on the first and second loudness representations; and (d) causing the playback device to play back media based on the second equalization setting and the determined loudness adjustment factor.

In another aspect, a device is provided. The device may include a processor, a non-transitory computer-readable medium, and program instructions stored on the non-transitory computer-readable medium that, when executed by the processor, cause a playback device to perform operations. The operations may include (a) determining a first loudness representation for the playback device, where the playback device includes a first equalization setting, and where the first loudness representation is based on the first equalization setting applied to a representation of average music; (b) determining a second loudness representation for the playback device, where the playback device includes a second equalization setting, and where the second loudness representation is based on the second equalization setting applied to the representation of average music; (c) determining a loudness adjustment factor based on the first and second loudness representations; and (d) causing the playback device to play back media based on the second equalization setting and the determined loudness adjustment factor.

In yet another aspect, a device is provided. The device may include a processor, a non-transitory computer-readable medium, and program instructions stored on the non-transitory computer-readable medium that, when executed by the processor, cause a playback device to perform operations. The operations may include (a) determining a first loudness representation for a first playback device, where the first playback device includes a first equalization setting, and where the first loudness representation is based on the first equalization setting applied to a representation of average music; (b) determining a second loudness representation for a second playback device, where the second playback device includes a second equalization setting, and where the second loudness representation is based on the second equalization setting applied to the representation of average music; (c) determining a loudness adjustment factor based on the first and second loudness representations; and (d) causing the second playback device to play back media based on the second equalization setting and the determined loudness adjustment factor.

It will be understood by one of ordinary skill in the art that this disclosure includes numerous other embodiments. It will be understood by one of ordinary skill in the art that this disclosure includes numerous other examples. While some examples described herein may refer to operations performed by given actors such as "users" and/or other entities, it should be understood that this description is for purposes of explanation only. The claims should not be interpreted to require action by any such example actor unless explicitly required by the language of the claims themselves.

While some examples described herein may refer to operations performed by given actors such as "users" and/or other entities, it should be understood that this is for purposes of explanation only. The claims should not be interpreted to require action by any such example actor unless explicitly required by the language of the claims themselves.

II. Example Operating Environment

FIG. 1 shows an example configuration of a media playback system 100 in which one or more embodiments disclosed herein may be practiced or implemented. The media playback system 100 as shown is associated with an example home environment having several rooms and spaces, such as for example, a master bedroom, an office, a dining room, and a living room. As shown in the example of FIG. 1, the media playback system 100 includes playback devices 102-124, control devices 126 and 128, and a wired or wireless network router 130.

Further discussions relating to the different components of the example media playback system 100 and how the different components may interact to provide a user with a media experience may be found in the following sections. While discussions herein may generally refer to the example media playback system 100, technologies described herein are not limited to applications within, among other things, the home environment as shown in FIG. 1. For instance, the technologies described herein may be useful in environments where multi-zone audio may be desired, such as, for example, a commercial setting like a restaurant, mall or airport, a vehicle like a sports utility vehicle (SUV), bus or car, a ship or boat, an airplane, and so on.

a. Example Playback Devices

Figure 2:
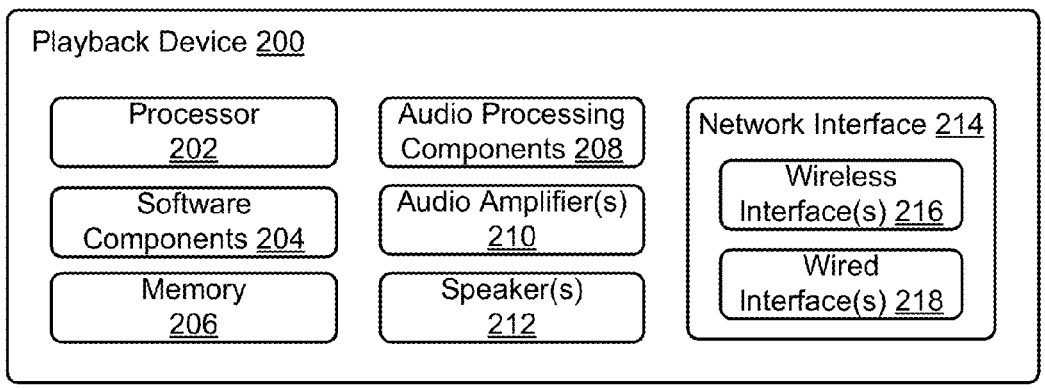
FIG. 2 shows a functional block diagram of an example playback device.

FIG. 2 shows a functional block diagram of an example playback device 200 that may be configured to be one or more of the playback devices 102-124 of the media playback system 100 of FIG. 1. The playback device 200 may include a processor 202, software components 204, memory 206, audio processing components 208, audio amplifier(s) 210, speaker(s) 212, and a network interface 214 including wireless interface(s) 216 and wired interface(s) 218. In one case, the playback device 200 may not include the speaker(s) 212, but rather a speaker interface for connecting the playback device 200 to external speakers. In another case, the playback device 200 may include neither the speaker(s) 212 nor the audio amplifier(s) 210, but rather an audio interface for connecting the playback device 200 to an external audio amplifier or audio-visual receiver.

In one example, the processor 202 may be a clock-driven computing component configured to process input data according to instructions stored in the memory 206. The memory 206 may be a tangible computer-readable medium configured to store instructions executable by the processor 202. For instance, the memory 206 may be data storage that can be loaded with one or more of the software components 204 executable by the processor 202 to achieve certain functions. In one example, the functions may involve the playback device 200 retrieving audio data from an audio source or another playback device. In another example, the functions may involve the playback device 200 sending audio data to another device or playback device on a network. In yet another example, the functions may involve pairing of the playback device 200 with one or more playback devices to create a multi-channel audio environment.

Certain functions may involve the playback device 200 synchronizing playback of audio content with one or more other playback devices. During synchronous playback, a listener will preferably not be able to perceive time-delay differences between playback of the audio content by the playback device 200 and the one or more other playback devices. U.S. Pat. No. 8,234,395 entitled, "System and method for synchronizing operations among a plurality of independently clocked digital data processing devices," which is hereby incorporated by reference, provides in more detail some examples for audio playback synchronization among playback devices.

The memory 206 may further be configured to store data associated with the playback device 200, such as one or more zones and/or zone groups the playback device 200 is a part of, audio sources accessible by the playback device 200, or a playback queue that the playback device 200 (or some other playback device) may be associated with. The data may be stored as one or more state variables that are periodically updated and used to describe the state of the playback device 200. The memory 206 may also include the data associated with the state of the other devices of the media system, and shared from time to time among the devices so that one or more of the devices have the most recent data associated with the system. Other embodiments are also possible.

The audio processing components 208 may include one or more digital-to-analog converters (DAC), an audio preprocessing component, an audio enhancement component or a digital signal processor (DSP), and so on. In one embodiment, one or more of the audio processing components 208 may be a subcomponent of the processor 202. In one example, audio content may be processed and/or intentionally altered by the audio processing components 208 to produce audio signals. The produced audio signals may then be provided to the audio amplifier(s) 210 for amplification and playback through speaker(s) 212. Particularly, the audio amplifier(s) 210 may include devices configured to amplify audio signals to a level for driving one or more of the speakers 212. The speaker(s) 212 may include an individual transducer (e.g., a "driver") or a complete speaker system involving an enclosure with one or more drivers. A particular driver of the speaker(s) 212 may include, for example, a subwoofer (e.g., for low frequencies), a mid-range driver (e.g., for middle frequencies), and/or a tweeter (e.g., for high frequencies). In some cases, each transducer in the one or more speakers 212 may be driven by an individual corresponding audio amplifier of the audio amplifier(s) 210. In addition to producing analog signals for playback by the playback device 200, the audio processing components 208 may be configured to process audio content to be sent to one or more other playback devices for playback.

Audio content to be processed and/or played back by the playback device 200 may be received from an external source, such as via an audio line-in input connection (e.g., an auto-detecting 3.5 mm audio line-in connection) or the network interface 214.

The network interface 214 may be configured to facilitate a data flow between the playback device 200 and one or more other devices on a data network. As such, the playback device 200 may be configured to receive audio content over the data network from one or more other playback devices in communication with the playback device 200, network devices within a local area network, or audio content sources over a wide area network such as the Internet. In one example, the audio content and other signals transmitted and received by the playback device 200 may be transmitted in the form of digital packet data containing an Internet Protocol (IP)-based source address and IP-based destination addresses. In such a case, the network interface 214 may be configured to parse the digital packet data such that the data destined for the playback device 200 is properly received and processed by the playback device 200.

As shown, the network interface 214 may include wireless interface(s) 216 and wired interface(s) 218. The wireless interface(s) 216 may provide network interface functions for the playback device 200 to wirelessly communicate with other devices (e.g., other playback device(s), speaker(s), receiver(s), network device(s), control device(s) within a data network the playback device 200 is associated with) in accordance with a communication protocol (e.g., any wireless standard including IEEE 802.11a, 802.11b, 802.11g, 802.11n, 802.11ac, 802.15, 4G mobile communication standard, and so on). The wired interface(s) 218 may provide network interface functions for the playback device 200 to communicate over a wired connection with other devices in accordance with a communication protocol (e.g., IEEE 802.3). While the network interface 214 shown in FIG. 2 includes both wireless interface(s) 216 and wired interface(s) 218, the network interface 214 may in some embodiments include only wireless interface(s) or only wired interface(s).

In one example, the playback device 200 and one other playback device may be paired to play two separate audio components of audio content. For instance, playback device 200 may be configured to play a left channel audio component, while the other playback device may be configured to play a right channel audio component, thereby producing or enhancing a stereo effect of the audio content. The paired playback devices (also referred to as "bonded playback devices") may further play audio content in synchrony with other playback devices.

In another example, the playback device 200 may be sonically consolidated with one or more other playback devices to form a single, consolidated playback device. A consolidated playback device may be configured to process and reproduce sound differently than an unconsolidated playback device or playback devices that are paired, because a consolidated playback device may have additional speaker drivers through which audio content may be rendered. For instance, if the playback device 200 is a playback device designed to render low frequency range audio content (i.e. a subwoofer), the playback device 200 may be consolidated with a playback device designed to render full frequency range audio content. In such a case, the full frequency range playback device, when consolidated with the low frequency playback device 200, may be configured to render only the mid and high frequency components of audio content, while the low frequency range playback device 200 renders the low frequency component of the audio content. The consolidated playback device may further be paired with a single playback device or yet another consolidated playback device.

By way of illustration, SONOS, Inc. presently offers (or has offered) for sale certain playback devices including a "PLAY:1," "PLAY:3," "PLAY:5," "PLAYBAR," "CONNECT:AMP," "CONNECT," and "SUB." Any other past, present, and/or future playback devices may additionally or alternatively be used to implement the playback devices of example embodiments disclosed herein. Additionally, it is understood that a playback device is not limited to the example illustrated in FIG. 2 or to the SONOS product offerings. For example, a playback device may include a wired or wireless headphone. In another example, a playback device may include or interact with a docking station for personal mobile media playback devices. In yet another example, a playback device may be integral to another device or component such as a television, a lighting fixture, or some other device for indoor or outdoor use.

b. Example Playback Zone Configurations

Referring back to the media playback system 100 of FIG. 1, the environment may have one or more playback zones, each with one or more playback devices. The media playback system 100 may be established with one or more playback zones, after which one or more zones may be added, or removed to arrive at the example configuration shown in FIG. 1. Each zone may be given a name according to a different room or space such as an office, bathroom, master bedroom, bedroom, kitchen, dining room, living room, and/or balcony. In one case, a single playback zone may include multiple rooms or spaces. In another case, a single room or space may include multiple playback zones.

As shown in FIG. 1, the balcony, dining room, kitchen, bathroom, office, and bedroom zones each have one playback device, while the living room and master bedroom zones each have multiple playback devices. In the living room zone, playback devices 104, 106, 108, and 110 may be configured to play audio content in synchrony as individual playback devices, as one or more bonded playback devices, as one or more consolidated playback devices, or any combination thereof. Similarly, in the case of the master bedroom, playback devices 122 and 124 may be configured to play audio content in synchrony as individual playback devices, as a bonded playback device, or as a consolidated playback device.

In one example, one or more playback zones in the environment of FIG. 1 may each be playing different audio content. For instance, the user may be grilling in the balcony zone and listening to hip hop music being played by the playback device 102 while another user may be preparing food in the kitchen zone and listening to classical music being played by the playback device 114. In another example, a playback zone may play the same audio content in synchrony with another playback zone. For instance, the user may be in the office zone where the playback device 118 is playing the same rock music that is being playing by playback device 102 in the balcony zone. In such a case, playback devices 102 and 118 may be playing the rock music in synchrony such that the user may seamlessly (or at least substantially seamlessly) enjoy the audio content that is being played out-loud while moving between different playback zones. Synchronization among playback zones may be achieved in a manner similar to that of synchronization among playback devices, as described in previously referenced U.S. Pat. No. 8,234,395.

As suggested above, the zone configurations of the media playback system 100 may be dynamically modified, and in some embodiments, the media playback system 100 supports numerous configurations. For instance, if a user physically moves one or more playback devices to or from a zone, the media playback system 100 may be reconfigured to accommodate the change(s). For instance, if the user physically moves the playback device 102 from the balcony zone to the office zone, the office zone may now include both the playback device 118 and the playback device 102. The playback device 102 may be paired or grouped with the office zone and/or renamed if so desired via a control device such as the control devices 126 and 128. On the other hand, if the one or more playback devices are moved to a particular area in the home environment that is not already a playback zone, a new playback zone may be created for the particular area.

Further, different playback zones of the media playback system 100 may be dynamically combined into zone groups or split up into individual playback zones. For instance, the dining room zone and the kitchen zone 114 may be combined into a zone group for a dinner party such that playback devices 112 and 114 may render audio content in synchrony. On the other hand, the living room zone may be split into a television zone including playback device 104, and a listening zone including playback devices 106, 108, and 110, if the user wishes to listen to music in the living room space while another user wishes to watch television.

c. Example Control Devices

Figure 3:
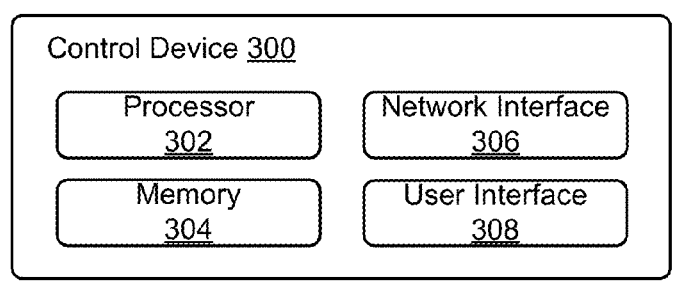
FIG. 3 shows a functional block diagram of an example control device.

FIG. 3 shows a functional block diagram of an example control device 300 that may be configured to be one or both of the control devices 126 and 128 of the media playback system 100. As shown, the control device 300 may include a processor 302, memory 304, a network interface 306, and a user interface 308. In one example, the control device 300 may be a dedicated controller for the media playback system 100. In another example, the control device 300 may be a network device on which media playback system controller application software may be installed, such as for example, an iPhone™, iPad™ or any other smart phone, tablet or network device (e.g., a networked computer such as a PC or Mac™).

The processor 302 may be configured to perform functions relevant to facilitating user access, control, and configuration of the media playback system 100. The memory 304 may be configured to store instructions executable by the processor 302 to perform those functions. The memory 304 may also be configured to store the media playback system controller application software and other data associated with the media playback system 100 and the user.

In one example, the network interface 306 may be based on an industry standard (e.g., infrared, radio, wired standards including IEEE 802.3, wireless standards including IEEE 802.11a, 802.11b, 802.11g, 802.11n, 802.11ac, 802.15, 4G mobile communication standard, and so on). The network interface 306 may provide a means for the control device 300 to communicate with other devices in the media playback system 100. In one example, data and information (e.g., such as a state variable) may be communicated between control device 300 and other devices via the network interface 306. For instance, playback zone and zone group configurations in the media playback system 100 may be received by the control device 300 from a playback device or another network device, or transmitted by the control device 300 to another playback device or network device via the network interface 306. In some cases, the other network device may be another control device.

Playback device control commands such as volume control and audio playback control may also be communicated from the control device 300 to a playback device via the network interface 306. As suggested above, changes to configurations of the media playback system 100 may also be performed by a user using the control device 300. The configuration changes may include adding/removing one or more playback devices to/from a zone, adding/removing one or more zones to/from a zone group, forming a bonded or consolidated player, separating one or more playback devices from a bonded or consolidated player, among others. Accordingly, the control device 300 may sometimes be referred to as a controller, whether the control device 300 is a dedicated controller or a network device on which media playback system controller application software is installed.

Figure 4:
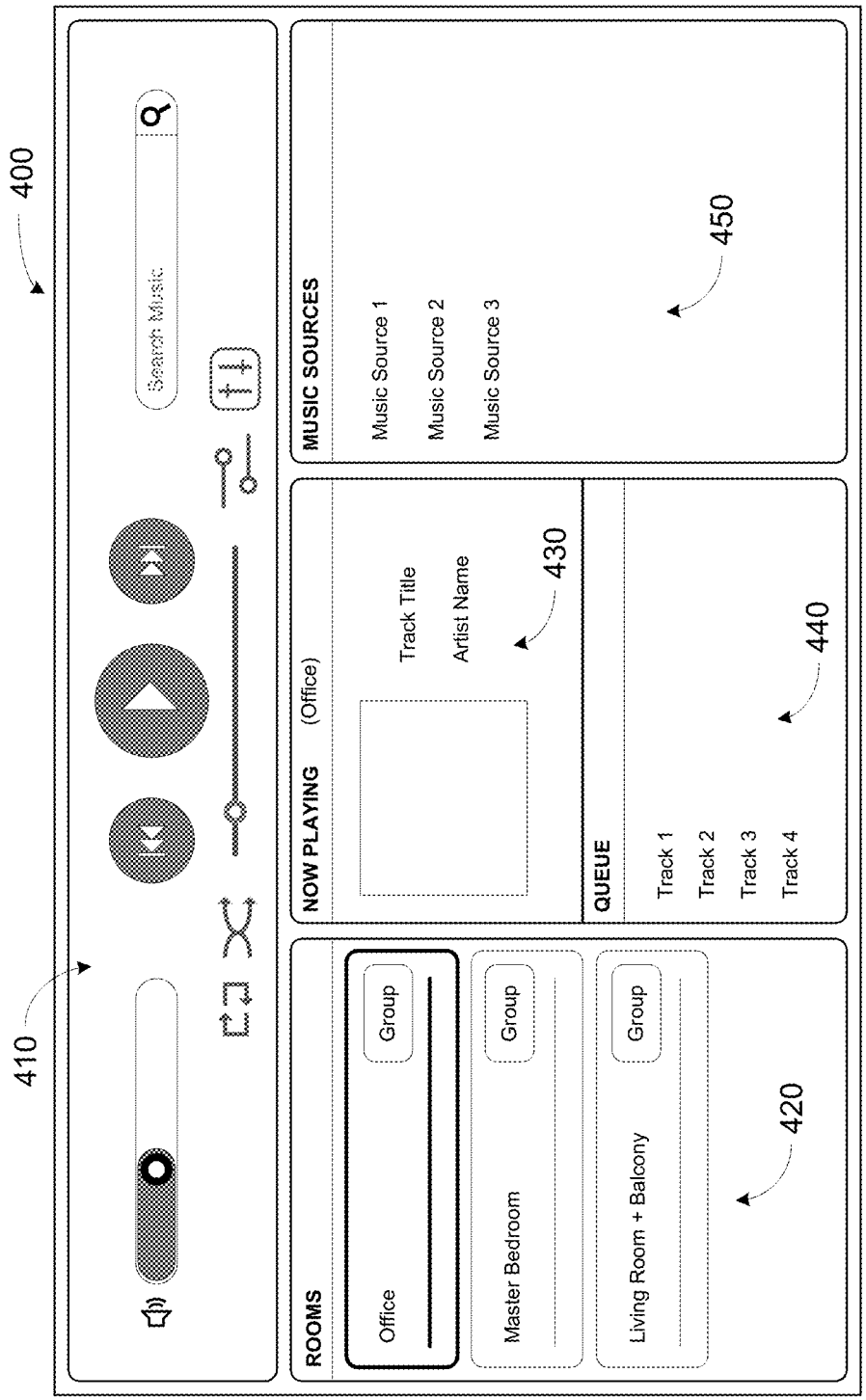
FIG. 4 shows an example controller interface.

The user interface 308 of the control device 300 may be configured to facilitate user access and control of the media playback system 100, by providing a controller interface such as the controller interface 400 shown in FIG. 4. The controller interface 400 includes a playback control region 410, a playback zone region 420, a playback status region 430, a playback queue region 440, and an audio content sources region 450. The user interface 400 as shown is just one example of a user interface that may be provided on a network device such as the control device 300 of FIG. 3 (and/or the control devices 126 and 128 of FIG. 1) and accessed by users to control a media playback system such as the media playback system 100. Other user interfaces of varying formats, styles, and interactive sequences may alternatively be implemented on one or more network devices to provide comparable control access to a media playback system.

The playback control region 410 may include selectable (e.g., by way of touch or by using a cursor) icons to cause playback devices in a selected playback zone or zone group to play or pause, fast forward, rewind, skip to next, skip to previous, enter/exit shuffle mode, enter/exit repeat mode, enter/exit cross fade mode. The playback control region 410 may also include selectable icons to modify equalization settings, and playback volume, among other possibilities.

The playback zone region 420 may include representations of playback zones within the media playback system 100. In some embodiments, the graphical representations of playback zones may be selectable to bring up additional selectable icons to manage or configure the playback zones in the media playback system, such as a creation of bonded zones, creation of zone groups, separation of zone groups, and renaming of zone groups, among other possibilities.

For example, as shown, a "group" icon may be provided within each of the graphical representations of playback zones. The "group" icon provided within a graphical representation of a particular zone may be selectable to bring up options to select one or more other zones in the media playback system to be grouped with the particular zone. Once grouped, playback devices in the zones that have been grouped with the particular zone will be configured to play audio content in synchrony with the playback device(s) in the particular zone. Analogously, a "group" icon may be provided within a graphical representation of a zone group. In this case, the "group" icon may be selectable to bring up options to deselect one or more zones in the zone group to be removed from the zone group. Other interactions and implementations for grouping and ungrouping zones via a user interface such as the user interface 400 are also possible. The representations of playback zones in the playback zone region 420 may be dynamically updated as playback zone or zone group configurations are modified.

The playback status region 430 may include graphical representations of audio content that is presently being played, previously played, or scheduled to play next in the selected playback zone or zone group. The selected playback zone or zone group may be visually distinguished on the user interface, such as within the playback zone region 420 and/or the playback status region 430. The graphical representations may include track title, artist name, album name, album year, track length, and other relevant information that may be useful for the user to know when controlling the media playback system via the user interface 400.

The playback queue region 440 may include graphical representations of audio content in a playback queue associated with the selected playback zone or zone group. In some embodiments, each playback zone or zone group may be associated with a playback queue containing information corresponding to zero or more audio items for playback by the playback zone or zone group. For instance, each audio item in the playback queue may comprise a uniform resource identifier (URI), a uniform resource locator (URL) or some other identifier that may be used by a playback device in the playback zone or zone group to find and/or retrieve the audio item from a local audio content source or a networked audio content source, possibly for playback by the playback device.

In one example, a playlist may be added to a playback queue, in which case information corresponding to each audio item in the playlist may be added to the playback queue. In another example, audio items in a playback queue may be saved as a playlist. In a further example, a playback queue may be empty, or populated but "not in use" when the playback zone or zone group is playing continuously streaming audio content, such as Internet radio that may continue to play until otherwise stopped, rather than discrete audio items that have playback durations. In an alternative embodiment, a playback queue can include Internet radio and/or other streaming audio content items and be "in use" when the playback zone or zone group is playing those items. Other examples are also possible.

When playback zones or zone groups are "grouped" or "ungrouped," playback queues associated with the affected playback zones or zone groups may be cleared or re-associated. For example, if a first playback zone including a first playback queue is grouped with a second playback zone including a second playback queue, the established zone group may have an associated playback queue that is initially empty, that contains audio items from the first playback queue (such as if the second playback zone was added to the first playback zone), that contains audio items from the second playback queue (such as if the first playback zone was added to the second playback zone), or a combination of audio items from both the first and second playback queues. Subsequently, if the established zone group is ungrouped, the resulting first playback zone may be re-associated with the previous first playback queue, or be associated with a new playback queue that is empty or contains audio items from the playback queue associated with the established zone group before the established zone group was ungrouped. Similarly, the resulting second playback zone may be re-associated with the previous second playback queue, or be associated with a new playback queue that is empty, or contains audio items from the playback queue associated with the established zone group before the established zone group was ungrouped. Other examples are also possible.

Referring back to the user interface 400 of FIG. 4, the graphical representations of audio content in the playback queue region 440 may include track titles, artist names, track lengths, and other relevant information associated with the audio content in the playback queue. In one example, graphical representations of audio content may be selectable to bring up additional selectable icons to manage and/or manipulate the playback queue and/or audio content represented in the playback queue. For instance, a represented audio content may be removed from the playback queue, moved to a different position within the playback queue, or selected to be played immediately, or after any currently playing audio content, among other possibilities. A playback queue associated with a playback zone or zone group may be stored in a memory on one or more playback devices in the playback zone or zone group, on a playback device that is not in the playback zone or zone group, and/or some other designated device.

The audio content sources region 450 may include graphical representations of selectable audio content sources from which audio content may be retrieved and played by the selected playback zone or zone group. Discussions pertaining to audio content sources may be found in the following section.

d. Example Audio Content Sources

As indicated previously, one or more playback devices in a zone or zone group may be configured to retrieve for playback audio content (e.g. according to a corresponding URI or URL for the audio content) from a variety of available audio content sources. In one example, audio content may be retrieved by a playback device directly from a corresponding audio content source (e.g., a line-in connection). In another example, audio content may be provided to a playback device over a network via one or more other playback devices or network devices.

Example audio content sources may include a memory of one or more playback devices in a media playback system such as the media playback system 100 of FIG. 1, local music libraries on one or more network devices (such as a control device, a network-enabled personal computer, or a networked-attached storage (NAS), for example), streaming audio services providing audio content via the Internet (e.g., the cloud), or audio sources connected to the media playback system via a line-in input connection on a playback device or network devise, among other possibilities.

In some embodiments, audio content sources may be regularly added or removed from a media playback system such as the media playback system 100 of FIG. 1. In one example, an indexing of audio items may be performed whenever one or more audio content sources are added, removed or updated. Indexing of audio items may involve scanning for identifiable audio items in all folders/directory shared over a network accessible by playback devices in the media playback system, and generating or updating an audio content database containing metadata (e.g., title, artist, album, track length, among others) and other associated information, such as a URI or URL for each identifiable audio item found. Other examples for managing and maintaining audio content sources may also be possible.

The above discussions relating to playback devices, controller devices, playback zone configurations, and media content sources provide only some examples of operating environments within which functions and methods described below may be implemented. Other operating environments and configurations of media playback systems, playback devices, and network devices not explicitly described herein may also be applicable and suitable for implementation of the functions and methods.

III. Example Loudness Matching

As discussed above, examples described herein are directed to loudness matching on an example playback device.

Figure 5:
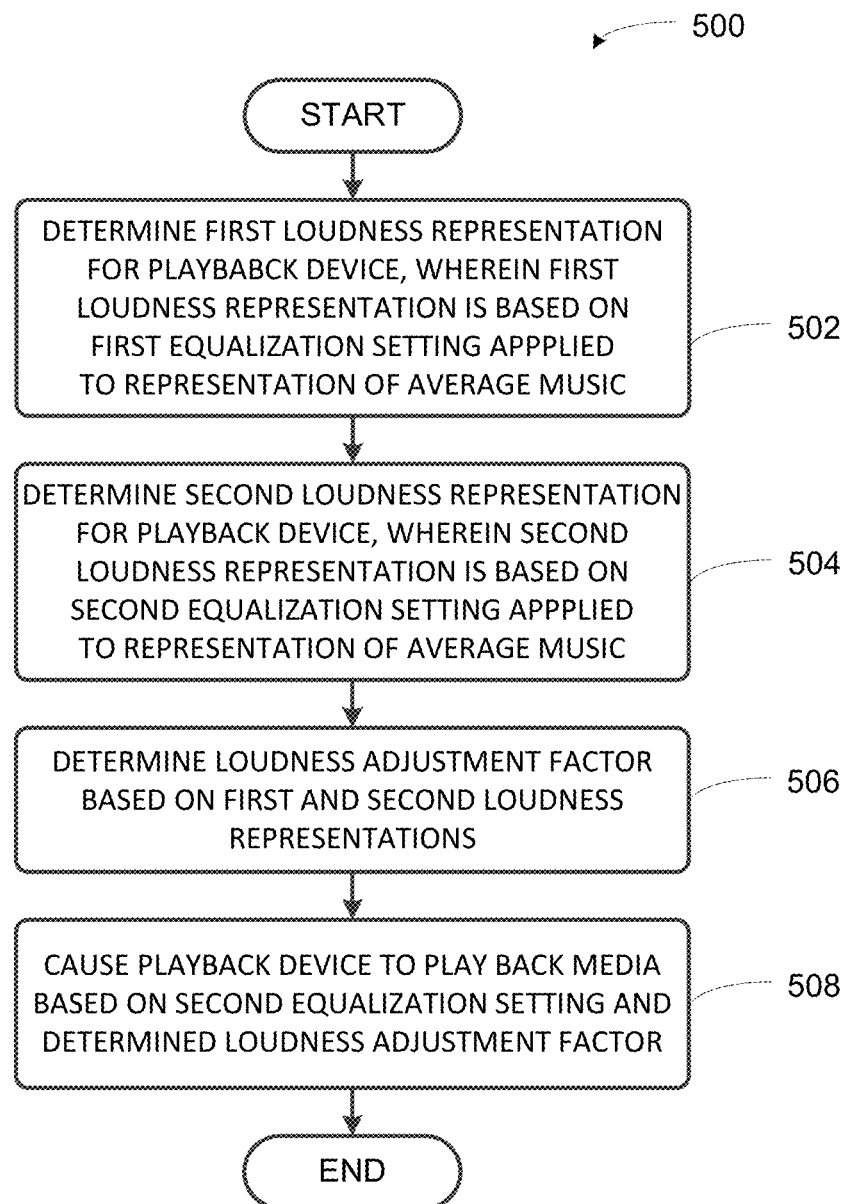
FIG. 5 shows an example flow diagram for loudness matching on an example playback device.
Figure 8:
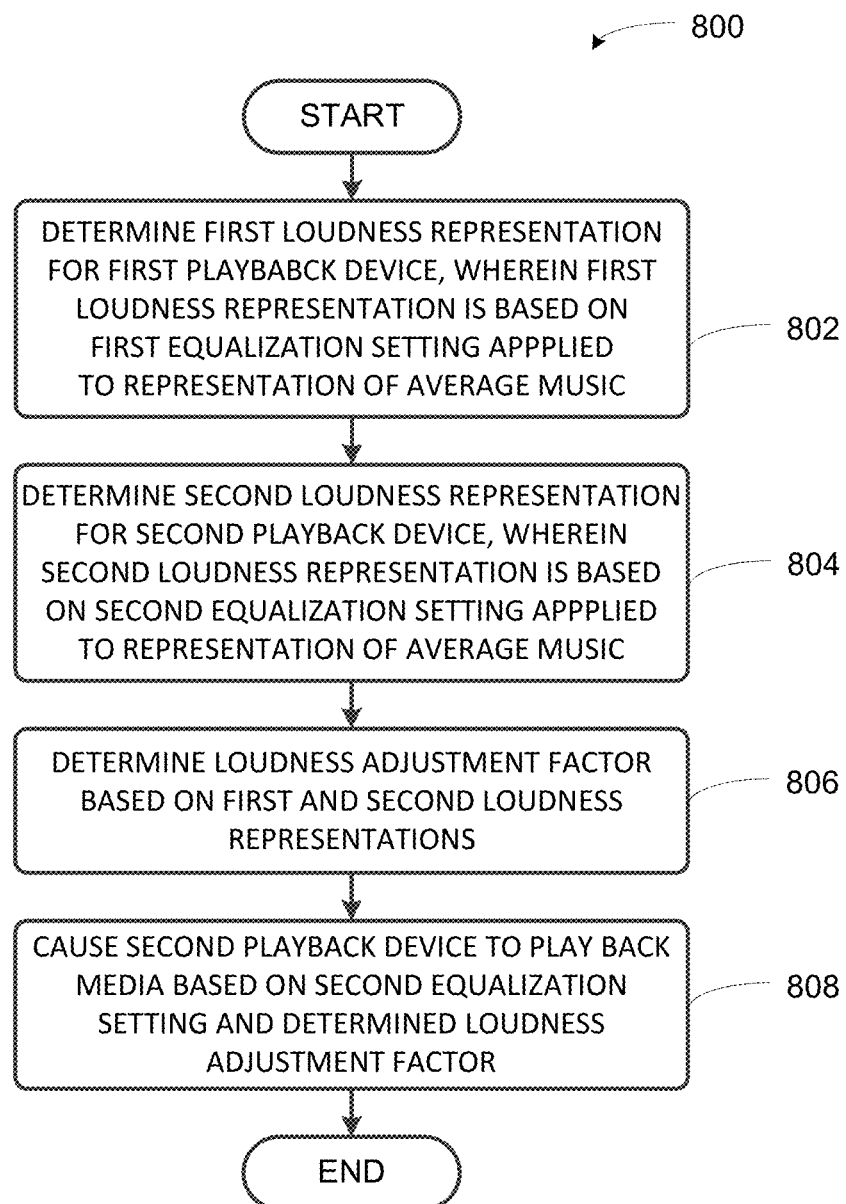
FIG. 8 shows an example flow diagram for loudness matching between a first and second playback device.

Methods 500 and 800 shown in FIGS. 5 and 8 present embodiments of methods that can be implemented within an operating environment involving, for example, the media playback system 100 of FIG. 1, one or more of the playback device 200 of FIG. 2, and one or more of the control device 300 of FIG. 3. Methods 500 and 800 may include one or more operations, functions, or actions as illustrated by one or more of blocks 502-508 and 802-808. Although the blocks are illustrated in sequential order, these blocks may also be performed in parallel, and/or in a different order than those described herein. Also, the various blocks may be combined into fewer blocks, divided into additional blocks, and/or removed based upon the desired implementation.

In addition, for the methods 500, 800, and other processes and methods disclosed herein, the flowchart shows functionality and operation of one possible implementation of present embodiments. In this regard, each block may represent a module, a segment, or a portion of program code, which includes one or more instructions executable by a processor for implementing specific logical functions or steps in the process. The program code may be stored on any type of computer readable medium, for example, such as a storage device including a disk or hard drive. The computer readable medium may include non-transitory computer readable medium, for example, such as computer-readable media that stores data for short periods of time like register memory, processor cache and Random Access Memory (RAM). The computer readable medium may also include non-transitory media, such as secondary or persistent long term storage, like read only memory (ROM), optical or magnetic disks, compact-disc read only memory (CD-ROM), for example. The computer readable media may also be any other volatile or non-volatile storage systems. The computer readable medium may be considered a computer readable storage medium, for example, or a tangible storage device. In addition, for the methods 500, 800, and other processes and methods disclosed herein, each block in FIGS. 5 and 8 may represent circuitry that is wired to perform the specific logical functions in the process.

Figure 6A:
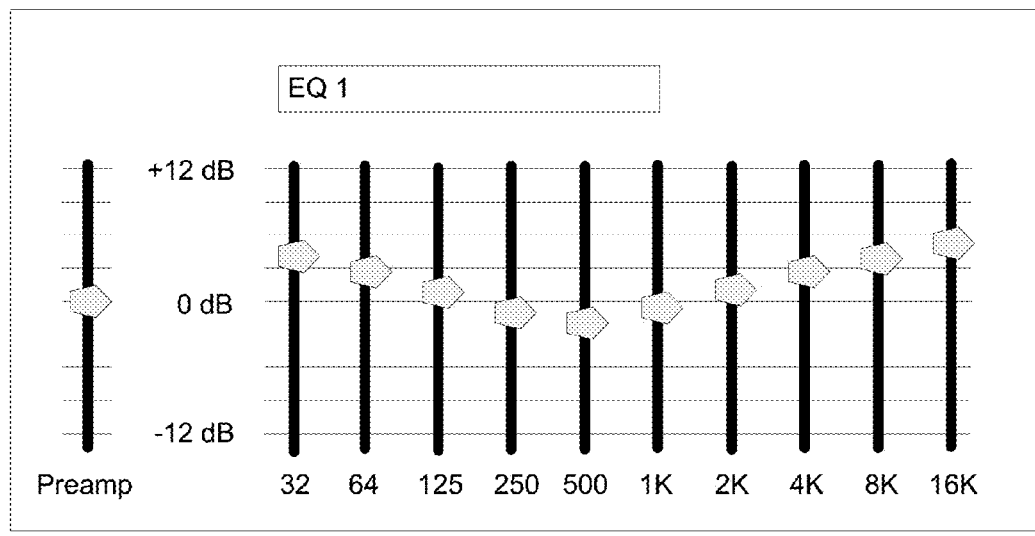
FIG. 6A shows a first example equalization setting for a playback device.
Figure 6B:
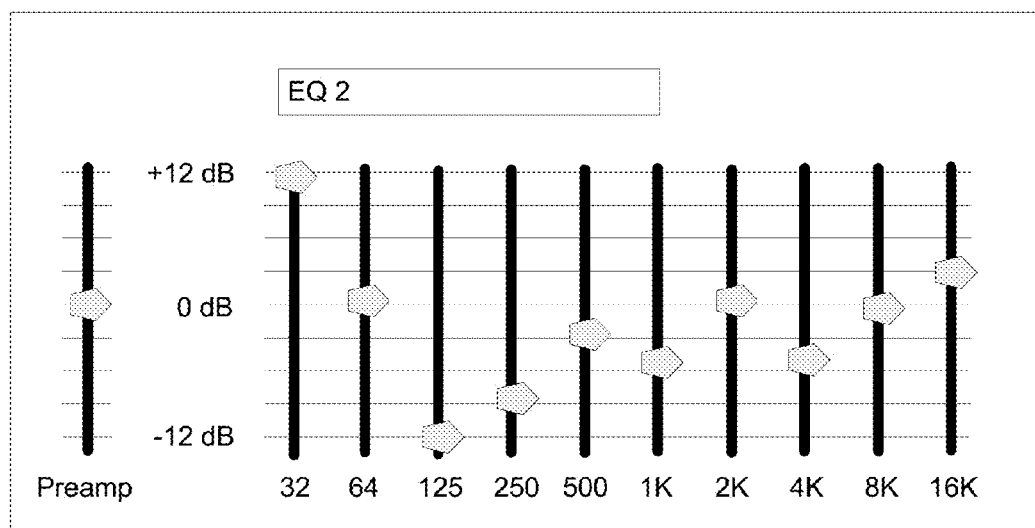
FIG. 6B shows a second example equalization setting for a playback device.

At block 502, a playback device may determine a first loudness representation for the playback device. The loudness representation may be a coefficient representing the human-perceived loudness of media that is played back by the playback device. For example, the playback device may be the playback device 200 shown in FIG. 2, and may have a first equalization setting, or "EQ", defining the frequency response for media that is played back by the playback device 200, as well as a second EQ. A first example EQ is shown in FIG. 6A, displayed on a 10-band graphical equalizer. A second example EQ, in a similar format, is shown in FIG. 6B. The first and second EQ might be expressed in numerous other ways, with more or less detail.

The first and second EQ may be associated with a first and second media source, respectively. For instance, the first EQ may be used when the playback device 200 is playing back multimedia audio for watching television or a movie, while the second EQ may be used when the playback device 200 is playing back media from a music streaming service. Additionally or alternatively, two different EQs might be associated with two different genres of music.

In another embodiment, the playback device 200 may undergo a calibration process that results in a new EQ for the playback device. For example, the first EQ may be a factory default EQ, and the second EQ may be the result of a calibration which occurs after the playback device 200 is placed in a desired media playback environment, such as the media playback system 100 shown in FIG. 1. A calibration of the playback device 200 may occur for other reasons as well. For instance, the playback device 200 may be moved to a different location in the media playback system 100, or it may be grouped into a zone with one or more of the other playback devices located in the system 100. Other examples are also possible. In each case, the playback device 200 may undergo a calibration that results in a different EQ.

As discussed in the following examples, each EQ may be stored in memory 206 of the playback device 200 as audio processing coefficients, such as a biquadratic digital signal processing filter coefficient ("biquad filter"). However, each EQ may be stored in other formats as well, such as an EQ graph, or its computational equivalent. Further, each EQ may additionally or alternatively be stored on a control device, such as the control device 300 shown in FIG. 3, a separate playback device, or a remote server. Other examples are also possible.

Figure 7:
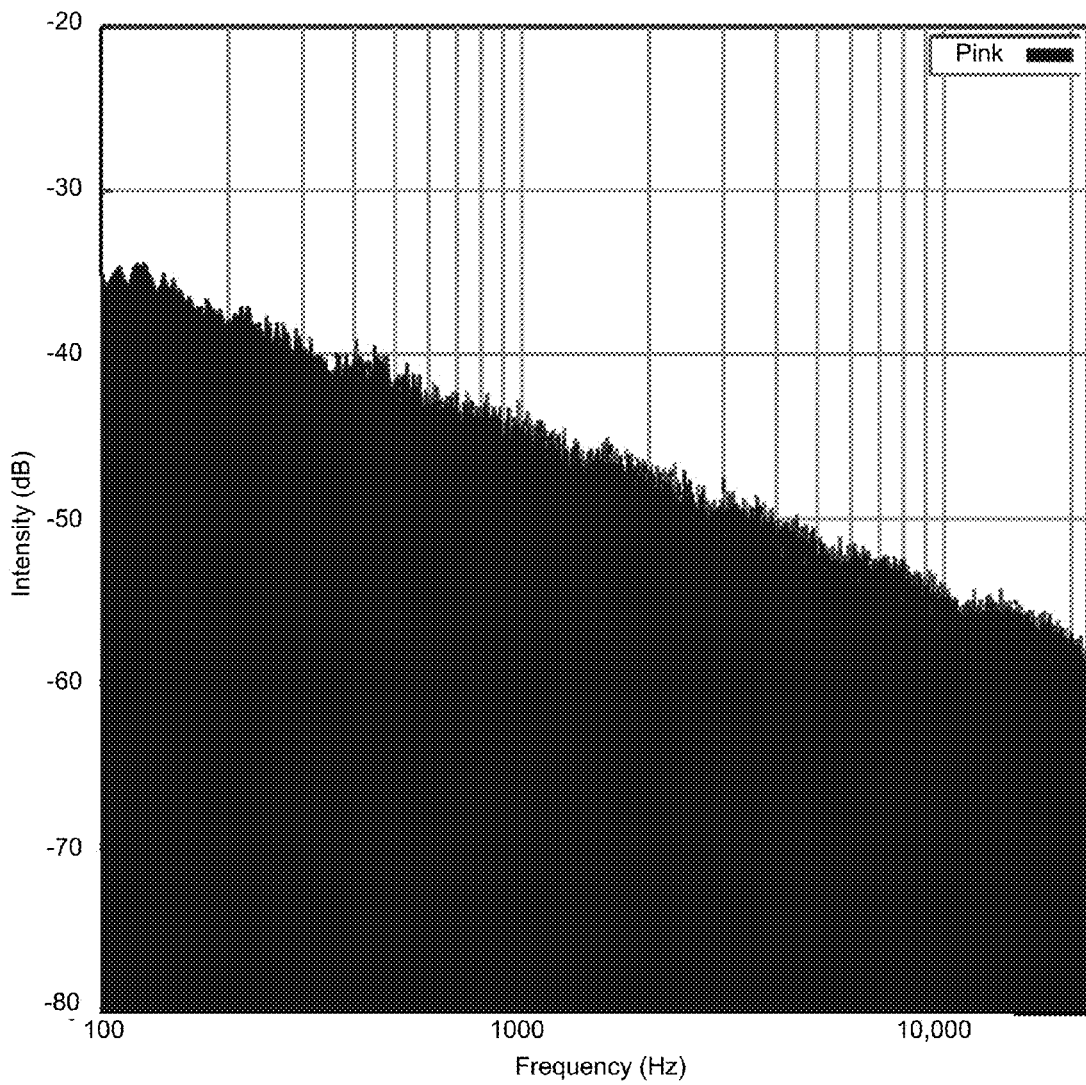
FIG. 7 shows an example frequency dropoff curve for pink noise.

The playback device 200 may determine the first loudness representation by applying the first EQ to a representation of "average music." The representation of average music may be, for instance, a power-frequency graph that approximates the spectral content of media that the playback device 200 may play back. The representation of average music may be predetermined, or it may be selected by a user. For example, in some implementations the representation of average music may be a power-frequency dropoff curve corresponding to 1/f noise, also known as pink noise, which is often used in audio applications. FIG. 7 shows a graphical representation of the dropoff curve for pink noise.

In other examples, a specific representation of average music may be selected based on a user preference, such as a particular style or genre of music. In still further examples, the representation of average music may be generated based on the media that is to be played back as a model. For instance, the playback device 200 may determine the media to be played back and sample at least a portion of that media. Then, based on the sampled portion, the playback device 200 may determine a power-frequency dropoff curve corresponding to the media to be played back. The sampled curve may then be used for the representation of average music. Other representations for the spectral content of average music are also possible.

The representation of average music may be stored in memory 206 on the playback device 200, in memory 304 on the control device 300, or on a remove server, among other locations. In some cases, the representation of average music may be stored on a second playback device that may act as a zone coordinator for a zone of grouped playback devices. Other possibilities also exist.

Further, a playback device 200 might utilize more than one representation of average music. For instance, just as the playback device 200 may include multiple EQs corresponding to different media sources, music content, etc., the playback device 200 may also store and utilize multiple representations of average music to be used for loudness matching. The multiple representations of average music may correspond to the different music genres, such as classical, rock, metal, or country—although each EQ need not have a corresponding representation of average music. As a result, several EQ/average music combinations may be possible for the playback device 200.

As noted above, the playback device 200 may apply the first EQ to the selected representation of average music. For instance, the playback device 200 may convert the first EQ from the biquad filter to the frequency domain via a z-transform, and may then multiply the first EQ by the average music dropoff curve. This yields the power-spectral density of the selected average music, subject to the first EQ. The playback device 200 may then pass the determined power-spectral density of the first EQ/average music combination through a loudness determination algorithm, such as those developed by Moore & Glasberg, or by Zwicker's method, for example. These models may yield the first loudness representation, expressed as a loudness coefficient. Other models for obtaining a representation for the human-perceptual loudness of a given EQ/average music pairing may also be possible.

At block 504, the playback device 200 may determine a second loudness representation for the playback device 200 in a similar fashion, by applying the second EQ to the representation of average music. The playback device 200 may then pass the power-spectral density of the second EQ/average music combination through the loudness determination algorithm, as above, to obtain the second loudness representation, which may again be a loudness coefficient.

In some cases, the loudness model used to determine the perceived loudness representation for a given EQ/average music pairing may be adjusted based on contextual factors. In some cases, a first and second EQ might be loudness matched between two different playback devices, rather than on the single playback device 200. Further, the two playback devices may be different production models with different physical components. For example, the first EQ may correspond to a first playback device 200 with a given power output, while the second EQ may correspond to a second, larger playback device 220 with a higher power output than the first playback device 200. In this case, the perceived loudness model may account for the playback devices' relative power outputs by increasing the loudness of the second playback device, or discounting the loudness of the first. Other adjustments to the loudness determination model are also possible based on media content variation, such as media source, music genre, etc.

At block 506, the playback device 200 may determine a loudness adjustment factor based on the first and second loudness representations. For instance, the playback device 200 may determine the difference between the two loudness representations by subtracting the second loudness coefficient from the first, producing a loudness adjustment factor that may then be associated with the second EQ. In some cases, where loudness matching occurs between playback devices, the playback device 200 may cause the loudness adjustment factor to be stored in memory on the second playback device that is using the second EQ. Further, the loudness adjustment factor associated with the second EQ may be stored in memory 304 on the control device 300, or on a remote server, to be later shared with and utilized by any playback device in the media playback system 100 that uses the second EQ.

In some implementations, the playback device 200 may modify the loudness adjustment factor that is associated with a given EQ. Such a modification may be undertaken irrespective of a change in the EQ or the representation of average music. For instance, the playback device 200 may update the loudness adjustment factor based on contextual information such as metadata associated with the media to be played back. For example, some genres of music, such as heavy metal, might be expected to be louder than others, and thus the playback device 200 may increase the loudness adjustment factor when it determines that heavy metal music is to be played.

Alternatively, in some examples, the playback device 200 may decrease the loudness adjustment factor based on similar reasoning if the media's metadata indicates genre of music that is relatively quieter, such as classical music. As discussed above with respect to the loudness determination model, modifications may also be made to the loudness adjustment factor based on media source, or the model and power output of the particular playback device. Other possibilities also exist.

At block 508, the playback device 200 may play back media based on the second EQ and the determined loudness adjustment factor. For example, the loudness adjustment factor may be applied as a numerator multiplier to the biquad filter of the second EQ, effectively shifting the second EQ up or down, similar to a gain shift. This loudness adjustment factor may be stored in memory and associated with the second EQ, and then used whenever the playback device 200 plays back media according to the second EQ. As a result, the perceived loudness of media playback may be near to or matching the perceived loudness of playback when the first EQ is used.

As discussed in the preceding example, the playback device 200 may automatically select the first EQ/average music pair as the datum to which the perceived loudness should be matched. However, other conventions are also possible. In an example where EQs are being loudness matched between devices, the EQ/average music of a particular playback device might take precedence, such as a zone coordinator or the center channel is a multi-channel zone. In some instances, a user might manually select which EQ/average music combination to use for the baseline loudness. In yet another example, a preferred EQ/average music combination might be stored on a playback device, control device, or server in the media playback system 100, and may be used as the datum for all loudness matching that occurs in the media playback system 100.

As noted throughout the examples above, it is possible that the first and second EQ may be on different playback devices, rather than the single playback device 200. In other words, the loudness matching described herein may also apply to matching the human-perceived loudness of a first EQ used on a first device, such as the playback device 200, with the loudness of a second EQ that is used on a second playback device.

For instance, at block 802 of the method 800 shown in FIG. 8, a first playback device, such as the playback device 200, may determine as first loudness representation as discussed above. At block 804, the first playback device 200 may determine a second loudness representation for a second playback device. Again, the determination of the second loudness representation may be carried out similarly to the examples above. The second playback device may be, for example, the playback device 220 shown in FIG. 9. At block 806, the first playback device 200 may determine a loudness adjustment factor based on the first and second loudness determinations, as noted above. And at block 808, the first playback device 200 may cause the second playback device 220 to play back media based on the second EQ and the determined loudness adjustment factor, according to the examples above.

Figure 9:
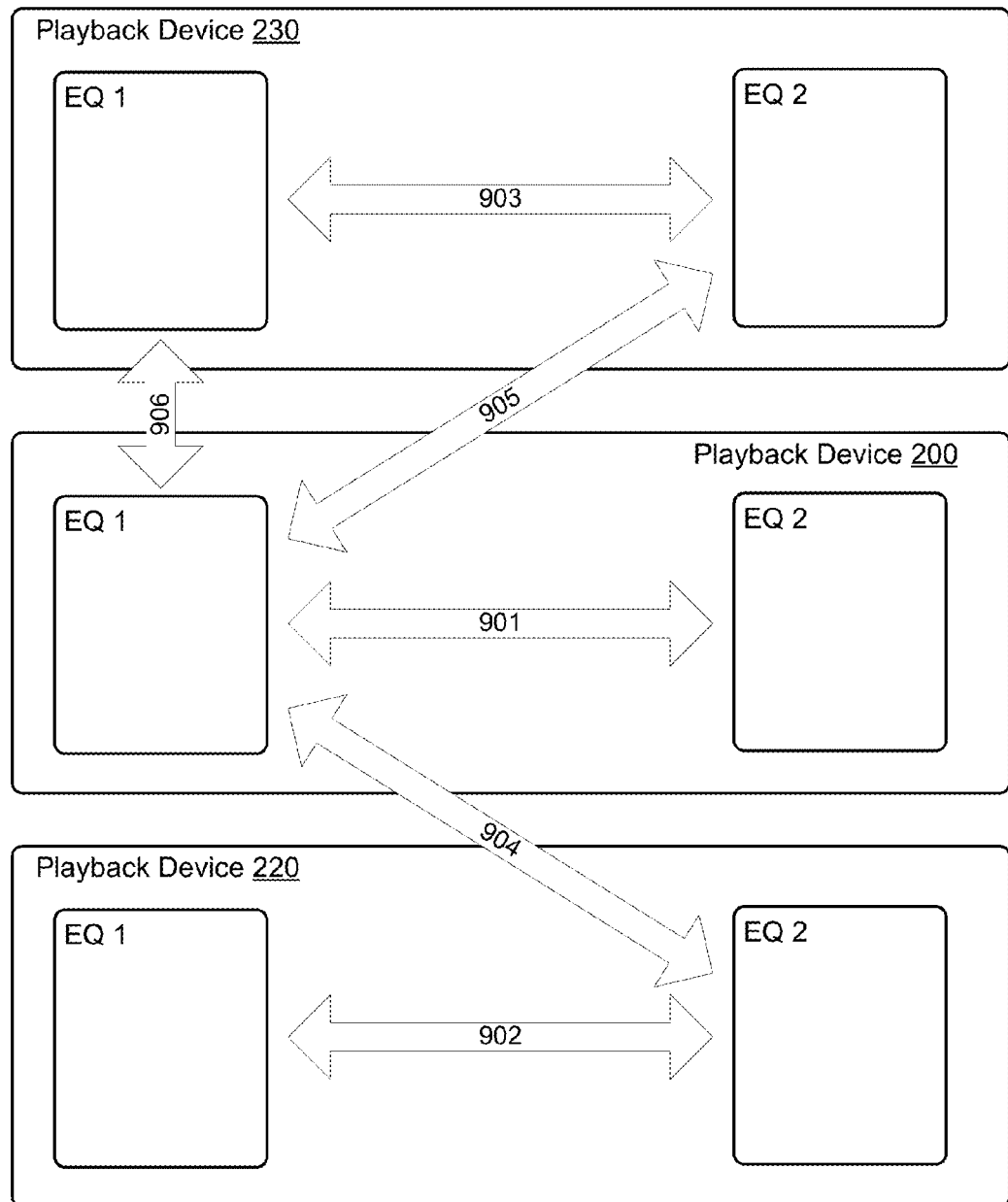
FIG. 9 shows examples of loudness matching among one or more playback devices.

Further, as illustrated in FIG. 9, loudness matching may occur between more than two devices, such as all playback devices that may be grouped in a bonded zone. FIG. 9 shows a third playback device 230, and illustrates some of the possible EQ/average music comparisons, shown by the double-sided arrows, that may be used for loudness matching in an environment with multiple playback devices. For instance, the three playback devices 200, 220, and 230 shown in FIG. 9 may correspond to the playback devices 104, 106, and 108 shown in the media playback system 100 of FIG. 1. These three playback devices may form all of or part of a bonded zone, i.e., the Living Room zone.

In an example embodiment, the playback devices shown in FIG. 9 may each have a first EQ. The playback devices may then undergo a calibration procedure, yielding a second EQ for each of the devices. Following the calibration, loudness matching among the playback devices may occur in a number of different permutations. For instance, the arrow 901 may represent the comparison of a first and second EQ/average music combination on the playback device 200, as discussed in the examples above. A similar comparison for the individual playback devices 220 and 230 is shown by arrows 902 and 903, respectively. In these examples, each individual playback device may match its own perceived loudness from prior to the calibration.

Alternatively, the EQ/average music comparison may occur between the second EQ of each device and the first EQ of the first playback device 200. These comparisons are represented by the arrows 901, 904, and 905. In this case, the playback device 200, corresponding to the playback device 104 in FIG. 1, may represent the center channel of a media surround system. This may dictate, based on either predetermined program instruction or by user preference, that the perceived loudness of playback device 200 should be matched by all playback devices in the Living Room zone.

In another example, a first calibration procedure matching the loudness of playback devices 200 and 220 may be performed before playback device 230 is added to the media playback system 100. In this case, loudness matching may occur when playback device 230 is grouped with devices 200 and 220, and the EQ/average music comparison may take place between the current EQs of the playback devices 200 and 230, shown by the arrow 906. Here, the perceived loudness of third playback device 230 may be matched to that of the first playback device 200.

Numerous other permutations for loudness matching between two or more playback devices are possible. For instance, the examples shown in FIG. 9 only consider using a single representation of average music when comparing two EQs. However, as noted above, more than one representation of average music may be used, which may lead to many more possible EQ/average music comparisons. Further, additional playback devices, such as the playback device 110, could be added to the examples shown in FIG. 9.

In some cases, the loudness matching discussed in the foregoing paragraphs may occur as a result of a loudness matching command received from a user input. However, the loudness matching may occur based on other triggers as well. For instance, loudness matching may occur at a defined stage in a calibration process. This may reduce loudness-biasing during the calibration of a first and second EQ. In another example, loudness matching may occur between playback devices whenever two or more devices are grouped together in a playback zone. In yet another example, loudness matching may occur between two or more grouped playback devices whenever new media content is selected for playback, as a new representation of average music or a new loudness adjustment factor might be determined with each content selection. Other examples are also possible.

Additionally, although the loudness matching operations above are discussed as occurring on the playback device 200, it is also possible that the loudness matching may occur, in whole or in part, on the control device 300 that is in communication with one or more of the playback devices in the media playback system 100. The operations may additionally or alternatively be performed on a remote server. Other examples are also possible.

IV. Conclusion

The description above discloses, among other things, various example systems, methods, apparatus, and articles of manufacture including, among other components, firmware and/or software executed on hardware. It is understood that such examples are merely illustrative and should not be considered as limiting. For example, it is contemplated that any or all of the firmware, hardware, and/or software aspects or components can be embodied exclusively in hardware, exclusively in software, exclusively in firmware, or in any combination of hardware, software, and/or firmware. Accordingly, the examples provided are not the only way(s) to implement such systems, methods, apparatus, and/or articles of manufacture.

As indicated above, example techniques involve loudness matching on a playback device. In one aspect, a method is provided. The method may involve (a) determining a first loudness representation for a playback device, where the playback device includes a first equalization setting, and where the first loudness representation is based on the first equalization setting applied to a representation of average music; (b) determining a second loudness representation for the playback device, where the playback device includes a second equalization setting, and where the second loudness representation is based on the second equalization setting applied to the representation of average music; (c) determining a loudness adjustment factor based on the first and second loudness representations; and (d) causing the playback device to play back media based on the second equalization setting and the determined loudness adjustment factor.

In another aspect, a device is provided. The device may include a processor, a non-transitory computer-readable medium, and program instructions stored on the non-transitory computer-readable medium that, when executed by the processor, cause a playback device to perform operations. The operations may include (a) determining a first loudness representation for the playback device, where the playback device includes a first equalization setting, and where the first loudness representation is based on the first equalization setting applied to a representation of average music; (b) determining a second loudness representation for the playback device, where the playback device includes a second equalization setting, and where the second loudness representation is based on the second equalization setting applied to the representation of average music; (c) determining a loudness adjustment factor based on the first and second loudness representations; and (d) causing the playback device to play back media based on the second equalization setting and the determined loudness adjustment factor.

In yet another aspect, a device is provided. The device may include a processor, a non-transitory computer-readable medium, and program instructions stored on the non-transitory computer-readable medium that, when executed by the processor, cause a playback device to perform operations. The operations may include (a) determining a first loudness representation for a first playback device, where the first playback device includes a first equalization setting, and where the first loudness representation is based on the first equalization setting applied to a representation of average music; (b) determining a second loudness representation for a second playback device, where the second playback device includes a second equalization setting, and where the second loudness representation is based on the second equalization setting applied to the representation of average music; (c) determining a loudness adjustment factor based on the first and second loudness representations; and (d) causing the second playback device to play back media based on the second equalization setting and the determined loudness adjustment factor.

Additionally, references herein to "embodiment" means that a particular feature, structure, or characteristic described in connection with the embodiment can be included in at least one example embodiment of an invention. The appearances of this phrase in various places in the specification are not necessarily all referring to the same embodiment, nor are separate or alternative embodiments mutually exclusive of other embodiments. As such, the embodiments described herein, explicitly and implicitly understood by one skilled in the art, can be combined with other embodiments.

The specification is presented largely in terms of illustrative environments, systems, procedures, steps, logic blocks, processing, and other symbolic representations that directly or indirectly resemble the operations of data processing devices coupled to networks. These process descriptions and representations are typically used by those skilled in the art to most effectively convey the substance of their work to others skilled in the art. Numerous specific details are set forth to provide a thorough understanding of the present disclosure. However, it is understood to those skilled in the art that certain embodiments of the present disclosure can be practiced without certain, specific details. In other instances, well known methods, procedures, components, and circuitry have not been described in detail to avoid unnecessarily obscuring aspects of the embodiments. Accordingly, the scope of the present disclosure is defined by the appended claims rather than the forgoing description of embodiments.

When any of the appended claims are read to cover a purely software and/or firmware implementation, at least one of the elements in at least one example is hereby expressly defined to include a tangible, non-transitory medium such as a memory, DVD, CD, Blu-ray, and so on, storing the software and/or firmware.

We claim:

1. A device comprising:
   a processor;
   a non-transitory computer-readable medium; and
   program instructions stored on the non-transitory computer-readable medium that, when executed by the processor, cause the device to perform operations comprising:
      determining a first loudness representation for a playback device, wherein the playback device comprises a first equalization setting, and wherein the first loudness representation is based on the first equalization setting applied to a representation of average music, wherein the representation of average music comprises a power-frequency dropoff curve;
      determining a second loudness representation for the playback device, wherein the playback device comprises a second equalization setting, and wherein the second loudness representation is based on the second equalization setting applied to the representation of average music;
      determining a loudness adjustment factor based on the first and second loudness representations; and
      causing the playback device to play back media based on the second equalization setting and the determined loudness adjustment factor.

2. The device of claim 1, wherein the first and second equalization settings are associated with a first and second media source, respectively.

3. The device of claim 1, wherein the program instructions, when executed by the processor, further cause the device to perform operations comprising:
   causing the loudness adjustment factor to be stored in memory on a second playback device.

4. The device of claim 1, wherein determining the loudness adjustment factor comprises:
   determining a difference between the second loudness representation and the first loudness representation.

5. The device of claim 1, wherein the program instructions, when executed by the processor, further cause the device to perform operations comprising:
   updating the loudness adjustment factor based on metadata associated with the media to be played back; and
   causing the playback device to play back the media based on the second equalization setting and the updated loudness adjustment factor.

6. The device of claim 1, wherein the program instructions, when executed by the processor, further cause the device to perform operations comprising:
   determining the media to be played back, wherein determining the representation of average music is based on the determined media to be played back.

7. The device of claim 6, wherein the program instructions for determining the representation of average music, when executed by the processor, further cause the device to perform operations comprising:
   sampling at least a portion of the media to be played back; and
   based on sampling at least the portion of the media to be played back, determining the power-frequency dropoff curve for the media to be played back.

8. The device of claim 1, wherein the operations of determining (i) the first loudness representation, (ii) the second loudness representation, and (iii) the loudness adjustment factor are performed in response to a selection of the media to be played back by the playback device.

9. A method comprising:
   determining a first loudness representation for a playback device, wherein the playback device comprises a first equalization setting, and wherein the first loudness representation is based on the first equalization setting applied to a representation of average music, wherein the representation of average music comprises a power-frequency dropoff curve;
   determining a second loudness representation for the playback device, wherein the playback device comprises a second equalization setting, and wherein the second loudness representation is based on the second equalization setting applied to the representation of average music;
   determining a loudness adjustment factor based on the first and second loudness representations; and
   causing the playback device to play back media based on the second equalization setting and the determined loudness adjustment factor.

10. The method of claim 9, wherein the first and second equalization settings are associated with a first and second media source, respectively.

11. The method of claim 9, further comprising:
    causing the loudness adjustment factor to be stored in memory on a second playback device.

12. The method of claim 9, wherein determining the loudness adjustment factor, comprises determining a difference between the second loudness representation and the first loudness representation.

13. The method of claim 9, further comprising:
    updating the loudness adjustment factor based on metadata associated with the media to be played back; and
    causing the playback device to play back the media based on the second equalization setting and the updated loudness adjustment factor.

14. The method of claim 9, further comprising:
    determining the media to be played back, wherein determining the representation of average music is based on the determined media to be played back.

15. The method of claim 14, wherein determining the representation of average music comprises sampling at least a portion of the media to be played back and, based on sampling at least the portion of the media to be played back, determining the power-frequency dropoff curve for the media to be played back.

16. The method of claim 9, wherein determining (i) the first loudness representation, (ii) the second loudness representation, and (iii) the loudness adjustment factor are in response to a selection of the media to be played back by the playback device.

17. A device comprising:
    a processor;
    a non-transitory computer-readable medium; and
    program instructions stored on the non-transitory computer-readable medium that, when executed by the processor, cause the device to perform operations comprising:
       determining a first loudness representation for a first playback device, wherein the first playback device comprises a first equalization setting, and wherein the first loudness representation is based on the first equalization setting applied to a representation of average music;
       determining a second loudness representation for a second playback device, wherein the second playback device comprises a second equalization setting, and wherein the second loudness representation is based on the second equalization setting applied to the representation of average music;

determining a loudness adjustment factor based on the first and second loudness representations; and causing the second playback device to play back media based on the second equalization setting and the determined loudness adjustment factor.

18. The device of claim 17, wherein the program instructions, when executed by the processor, further cause the device to perform operations comprising:

causing the loudness adjustment factor to be stored in memory on the second playback device.

\* \* \* \* \*